United States Patent [19]

Ichijyo

[11] Patent Number: 4,843,307
[45] Date of Patent: Jun. 27, 1989

[54] VOLTAGE DIFFERENCE MEASURING EQUIPMENT

[75] Inventor: Hiroshi Ichijyo, Kawasaki, Japan

[73] Assignee: Kabushiki Kaisha Kenwood, Kanagawa, Japan

[21] Appl. No.: 40,824

[22] Filed: Apr. 21, 1987

[30] Foreign Application Priority Data

Apr. 24, 1986 [JP] Japan .................................. 61-93425
May 7, 1986 [JP] Japan .................................. 61-103155
Jan. 10, 1987 [JP] Japan .................................. 62-2615
Jan. 24, 1987 [JP] Japan .................................. 62-013350

[51] Int. Cl.$^4$ ..................... G01R 19/16; G01R 13/20
[52] U.S. Cl. ..................... 324/103 P; 324/102; 324/121 R
[58] Field of Search ............... 324/99 D, 103 P, 120, 324/121 R, 102; 364/839; 315/383

[56] References Cited

U.S. PATENT DOCUMENTS

| | | | |
|---|---|---|---|
| 2,591,738 | 4/1952 | Spencer | 324/102 |
| 2,880,392 | 3/1959 | Paulsen | 324/99 D |
| 3,063,018 | 11/1962 | Gordon et al. | 324/99 D |
| 3,188,455 | 6/1965 | Quick, Sr. | 364/839 |
| 4,271,391 | 6/1981 | Kmetz | 324/121 R |
| 4,476,432 | 10/1984 | Olson | 324/121 R |
| 4,510,444 | 4/1985 | Haussel et al. | 324/121 R |

Primary Examiner—Ernest F. Karlsen
Attorney, Agent, or Firm—Gerald J. Ferguson, Jr.

[57] ABSTRACT

A peak to peak or two-point voltage difference measuring equipment according to the present invention comprises: a control circuit; a D/A converter for converting the digital data given from the control circuit into the reference analog voltage; a comparator for comparing an input voltage signal with a reference analog voltage; means for gating the output of the comparator for a predetermined time segment interval; and means for holding the output of the gating means and applying to the control circuit.

2 Claims, 4 Drawing Sheets

TIME

VOLTAGE DIFFERENCE MEASURING EQUIPMENT

BACKGROUND OF THE INVENTION

1. Field of the Invention

The present invention relates to a voltage difference measuring equipment and, more particularly, to an equipment to measure the peak to peak voltage difference of the signal displayed on the screen of an oscilloscope or the voltage difference between two specific or designated points of this signal.

2. Related Background Art

In the conventional method of measuring the voltage difference, the voltage difference is measured using a voltmeter, digital multimeter, or the like.

As another method, the measured signal is displayed on the screen of the oscilloscope and the scale on the screen is read. However, according to the latter method, the voltage can be hardly directly read from the waveform displayed on the screen, so that there is a problem such that the voltage value is measured in consideration of the sensitivity or it is difficult to read the voltage value due to the positional relation with the scale.

SUMMARY OF THE INVENTION

It is an object of the present invention to provide a voltage difference measuring equipment which can solve the foregoing problems and, more particularly, to provide a voltage difference measuring equipment which can measure the peak to peak voltage difference or the voltage difference between two points which are designated on the time base.

In the first aspect of the invention, there is provided a voltage difference measuring equipment comprising: digital to analog (D/A) converting means; data supplying means for supplying digital data to the D/A converting means; an analog comparator to compare the analog signal converted by the D/A converting means with the measured signal; gate means for allowing the output of the analog comparator to pass only for the interval when a measure segment signal is applied; inversion detecting means for detecting that the output of the analog comparator passed through the gate means was inverted; and control means for changing the output digital data from the data supplying means, for reading the first output digital data from the data supplying means when the inversion was detected by the inversion detecting means, for reading the second output digital data from the data supplying means when it is detected by the inversion detecting means that the output of the analog comparator is not inverted after the first output digital data was read, and for calculating the voltage difference between the maximum voltage and the minimum voltage within the measure segment on the basis of the difference between both of the first and second output digital data.

In the second aspect of the invention, there is provided a voltage difference measuring equipment comprising: digital to analog (D/A) converting means; data supplying means for supplying digital data to the D/A converting means; an analog comparator to compare the analog signal converted by the D/A converting means with the measured signal; first detecting means for detecting the inversion of the output of the analog comparator at the first measure point; second detecting means for detecting the inversion of the output of the analog comparator at the second measure point; and control means for changing the output digital data from the data supplying means, for reading the first output digital data from the data supplying means when it is detected by the first detecting means that the output of the analog comparator was inverted, for reading the second output digital data from the data supplying means when it is detected by the second detecting means that the output of the analog comparator was inverted, and for calculating the voltage difference between the first and second measure points on the basis of the difference of both of the first and second digital output data which were read.

In the third aspect of the invention, there is provided a voltage difference measuring equipment comprising: digital to analog (D/A) converting means; an analog comparator for comparing the level of the analog signal converted by the D/A converting means with the level of the measured voltage, for generating the first output when the analog signal level is lower than the measured voltage level, and for generating the second output when the analog signal level is above the measured voltage level; gate means for allowing the output of the analog comparator to pass only for the interval when a measure segment signal is applied in correspondence to the sweep interval; and control means having a maximum value side register for performing the conversion of one bit on the maximum value side of the measured voltage and one bit on the minimum value side in association with the output of the analog comparator passed through the gate means by sequentially comparing both of those levels every interval above one subsequent sweep interval and for sequentially storing the result of the conversion on the maximum value side, a minimum value side register for sequentially storing the result of the conversion on the minimum side, and calculating means for calculating the difference between the contents of both registers on the maximum and minimum value sides, wherein the content of the maximum value side register and the content of the minimum value side register are alternately given to the D/A converting means.

In the fourth aspect of the invention, there is provided a voltage difference measuring equipment comprising: digital to analog (D/A) converting means; analog comparing means for comparing the level of the analog signal converted by the D/A converting means with the level of the measured voltage; first detecting means for receiving the output from the analog comparing means at the first measure point; second detecting means for receiving the output from the analog comparing means at the second measure point; and control means having a first register for performing the conversion of one bit on the side of the first measure point in association with the input received by the first detecting means and one bit on the side of the second measure point in association with the input received by the second detecting means by sequentially comparing both of those levels every interval above one subsequent sweep interval and for sequentially storing the result of the conversion on the side of the first measure point, a second register for sequentially storing the result of the conversion on the second measure point side, and calculating means for calculating the difference between the contents of both of the first and second registers, wherein the content of the first register and the content of the second register are alternately given to the D/A converting means.

DESCRIPTION OF PREFERRED EMBODIMENTS

Figure 1:
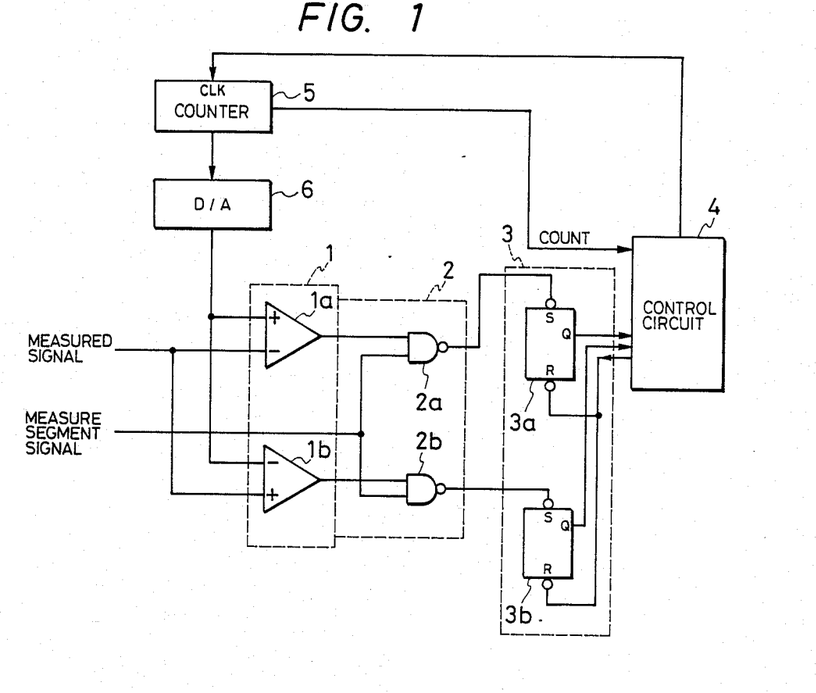
FIG. 1 shows a circuit constitutional diagram of a peak to peak voltage difference measuring equipment according to the first embodiment of the invention.

FIG. 1 is a block diagram showing a constitution of the first embodiment of the present invention.

An analog comparator 1 comprises analog comparators 1a and 1b. A measured signal is supplied to the inverting input terminal of the analog comparator 1a and to the non-inverting input terminal of the analog comparator 1b. The analog comparator 1 receives the measured signal and compares the measured signal with the output of a digital to analog converter (hereinafter, referred to as a D/A converter) 6. The output of the analog comparator 1a and a measure segment signal are supplied to a NAND gate 2a. A flip-flop 3a is set by the output of the NAND gate 2a.

Similarly, the output of the analog comparator 1a and a measure segment signal are supplied to a NAND gate 2b. A flip-flop 3b is set by the output of the NAND gate 2b.

The NAND gates 2a and 2b constitute gate means. The flip-flops 3a and 3b constitute inversion detecting means.

Figure 2A:
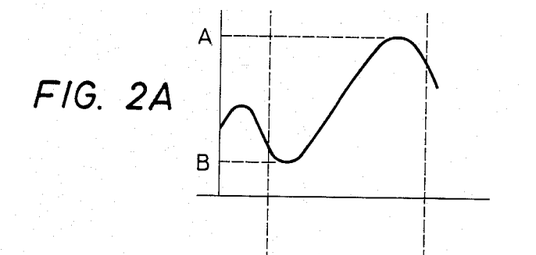
FIGS. 2A and 2B show a measured signal and a measure segment signal which are input to the circuit of FIG. 1, respectively.
Figure 2B:
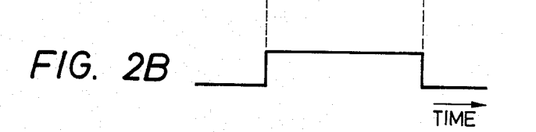

FIG. 2A shows an example of a measured signal waveform. FIG. 2B shows the measure segment signal. The measure segment signal is the signal having the logical value "1" (hereinafter, simply referred to as a high voltage). For example, the measure segment signal is the sweep interval signal of an oscilloscope.

A clock pulse is supplied to a counter 5 from a control circuit 4 and counted. The count value of the counter 5 is supplied to the D/A converter 6 and converted into the analog signal. This count value is also supplied to the control circuit 4.

It is now assumed that the input which is given to the D/A converter 6 starts from 0 (zero). In this case, when the analog voltage level from the D/A converter 6 is lower than the measured signal level, the output of the comparator 1a is set to the high level and the output of the comparator 1b is set to the low level. On the contrary, it is also possible to give the input by from the state in which all bits are "1". Each time a clock pulse is supplied to the counter 5, it is counted by the counter 5. The count value of the counter 5 is converted to the analog voltage and supplied to the analog comparator 1. The analog voltage and the measured signal are compared. When the analog voltage from the D/A converter 6 is larger than any portion of the measured signal and, at that portion the magnitude relation of them is reversed, the outputs of the analog comparator 1 (1a and 1b) are inverted. On the other hand, the outputs of the analog comparator 1 are gated by the signal to designate the measure segment. Therefore, when the inversion of the analog comparator 1 is performed within the measure segment, the flip-flop 3a is set and the Q output of the flip-flop 3a is set to a high voltage. The fact that the Q output of the flip-flop 3a was first set to the high voltage is detected by the control circuit 4 and the count value of the counter 5 is read. The flip-flop 3a is reset in response to the end of the reading of the count value.

Therefore, the above count value of the counter is equal to the minimum value B of the measured voltage. The input to the D/A converter 6 is started from the state in which all bits are "1" and this input is counted down one by one in the counter 5. With this constitution, when the Q output of the flip-flop 3b is first set to the high voltage, the count value of the counter 5 is read and becomes the maximum value.

Next, by supplying a clock pulse to the counter 5 while resetting the flip-flops 3a and 3b, the count value of the counter 5 is sequentially increased by "+1" from the above-mentioned value. This count-up operation is continued until the voltage level from the D/A converter 6 becomes higher than any portion of the measured signal so that the outputs of the analog comparators 1a and 1b are not inverted. The fact that the outputs of the analog comparator 1 are not first inverted is detected by the control circuit 4 on the basis of that the Q output of the flip-flop 3b is not set. In response to this detection, the count value of the counter 5 at that time is read. This count value is equal to the maximum value A of the measured voltage. On the other hand, if the input to the D/A converter 6 is started from the state in which all bits are "1" and the input is counted down one by one in the counter 5, when the Q output of the flip-flop 3a is not first set, the count value of the counter 5 is read and this value becomes the minimum value.

The difference (A-B) between the minimum value B and the maximum value A is calculated by the control circuit 4 and the peak to peak voltage is measured.

In this case, since the clock pulse is supplied to the counter 5 while resetting the flip-flops 3a and 3b for the interval between the minimum value B and the maximum value A, the measured signal does not need to monotonously increase or decrease for the interval between the minimum value B and the maximum value A.

Although the example in which the counter 5 is used has been described in the foregoing embodiment, a register may be also used in place of the counter 5. In the case of using the register, the registration value is given from the control circuit 4. For example, after a predetermined registration value was once given, the registration value may be sequentially changed by increasing or decreasing it.

According to the foregoing embodiment, the peak to peak voltage in an arbitrary measure segment of the waveform displayed on the screen of the oscilloscope can be measured with the simple constitution.

Figure 3:
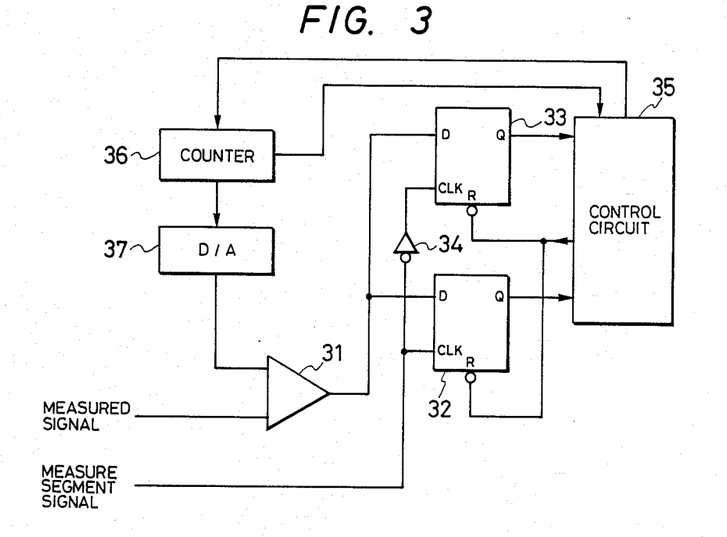
FIG. 3 shows a circuit constitutional diagram of two-point voltage difference measuring equipment according to the second embodiment of the invention.

FIG. 3 is a block diagram showing a constitution of the second embodiment of the invention.

The measured signal is supplied to an analog comparator 31 and compared with the output of a digital to analog (D/A) converter 37. The output of the analog comparator 31 is supplied as data to latch circuits 32 and 33 as D flip-flops. The measure segment signal is supplied as a clock signal to the latch circuit 32. The measure segment signal transmitted through an inverter 34 is supplied as a clock signal to the latch circuit 33.

A control circuit 35 supplies a clock pulse to a counter 36 and this clock pulse is counted. The count value of the clock pulses is supplied from the counter 36 to the D/A converter 37.

On the other hand, the Q outputs of the latch circuits 32 and 33 are supplied to the control circuit 35. The start point of the measure segment signal is set to the first measure point. Whether the output of the analog comparator 31 has been inverted or not is detected by checking the Q output of the latch circuit 32. When the output of the analog comparator 31 was inverted at the first measure point, the count value Na of the counter 36 is read. The end point of the measure segment signal is set to the second measure point. Whether the output of the analog comparator 31 has been inverted or not is detected by checking the Q output of the latch circuit 33. When the output of the analog comparator 31 was inverted at the second measure point, the count value Nb of the counter 36 is read. The difference (Na−Nb) is calculated.

Figure 4A:
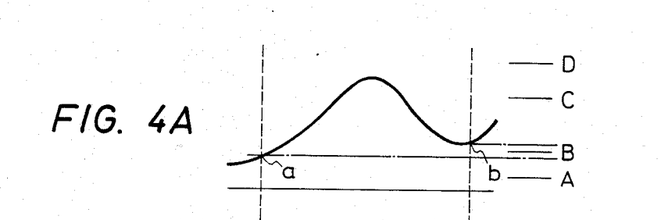
FIGS. 4A and 4B show a measured signal and a measure segment signal which are input to the circuit of FIG. 3, respectively.
Figure 4B:
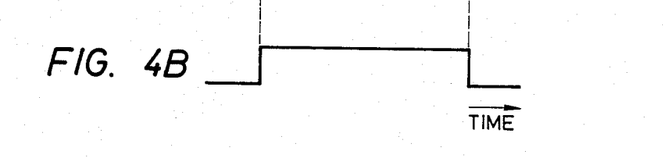

It is now assumed that the measured signal has such waveform as shown in FIG. 4A as an example. The measure segment signal is the signal having the logical value "1" (hereinafter, simply referred to as a high voltage). For example, the measure segment signal is the sweep interval signal of an oscilloscope. The measure segment signal may be also substituted by the signal which is formed by use of the sweep interval signal.

The counter 36 counts the clock pulses which are output from the control circuit 35. The count value is converted into the analog signal by the D/A converter 37 and compared with the measured voltage by the analog comparator 31.

It is now assumed that the initial value to the D/A converter 37 is set to "0" and the counter 36 performs the count-up operation.

Therefore, each time the clock pulse is output from the control circuit 35, the analog signal level of the D/A converter 37 increases. The following points will be understood by reference to FIG. 4A.

(i) When the analog signal level of the D/A converter 37 is "A", the Q outputs of the latch circuits 32 and 33 are set to the low voltage at the star and end points of the measure segment and lower than the measured signal level.

(ii) When the analog signal level of the D/A converter 37 is "B", the Q output of the latch circuit 32 is set to the high voltage at the start point of the measure segment. The Q output of the latch circuit 33 is set to the low voltage at the end point of the measure segment. Therefore, the level B is located between "a" and "b" of the measured signal level.

(iii) When the analog signal level of the D/A converter 37 is "C" and "D", the Q outputs of the latch circuits 32 and 33 are set to the high voltage at the start and end points of the measure segment ad higher than the measured signal level.

The analog signal level of the D/A converter 37 sequentially changes in accordance with an increase in the count value of the counter 36. Thus, the fact that the output of the analog comparator 31 was inverted is detected from the fact that the Q output of the latch circuit 32 had been changed from the low voltage to the high voltage in response to the leading edge of the measure segment signal. The count value Na of the counter 36 at this time is read. Similarly, when the Q output of the latch circuit 33 changes from the low voltage to the high voltage in response to the trailing edge of the measure segment signal, the fact that the output of the analog comparator 31 was inverted is detected. The count value Nb of the counter 36 at this time is read. Next, the difference (Na−Nb) is calculated. The latch circuits 32 and 33 and counter 36 are reset. Thus, the voltage difference between two points designated on the time base is obtained.

In the foregoing embodiment, the case where the counter 36 is used has been described as an example. However, a register may be also used in place of the counter 36. In the case of using the register, the registration value is given from the control circuit 35. For example, after a predetermined registration value was once given, the registration value may be also sequentially changed by increasing or decreasing. The registration value may be also arbitrarily changed.

The case where the measured voltage has the minimum value at the points near the start and end points of the measure segment as shown in FIG. 2 has been shown and described as an example. However, in the case where the measured voltage has the maximum value, on the contrary, the inversion of the output of the analog comparator 31 can be also similarly detected from the changes of the Q outputs of the latch circuits 32 and 33.

In particular, in the case where the measured signal has a repetitive waveform, the voltage difference can be easily measured.

According to the second embodiment described above, the voltage difference between two points designated on the time base can be measured by a simple constitution.

Figure 5:
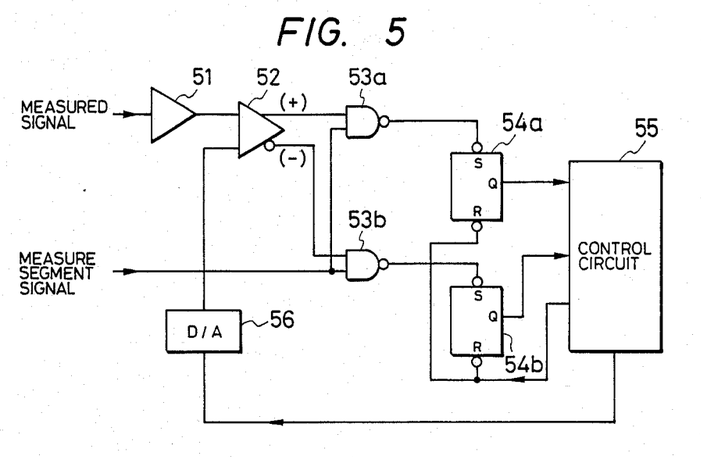
FIG. 5 shows a circuit constitutional diagram of a peak to peak voltage difference measuring equipment according to the third embodiment of the invention.
Figure 6:
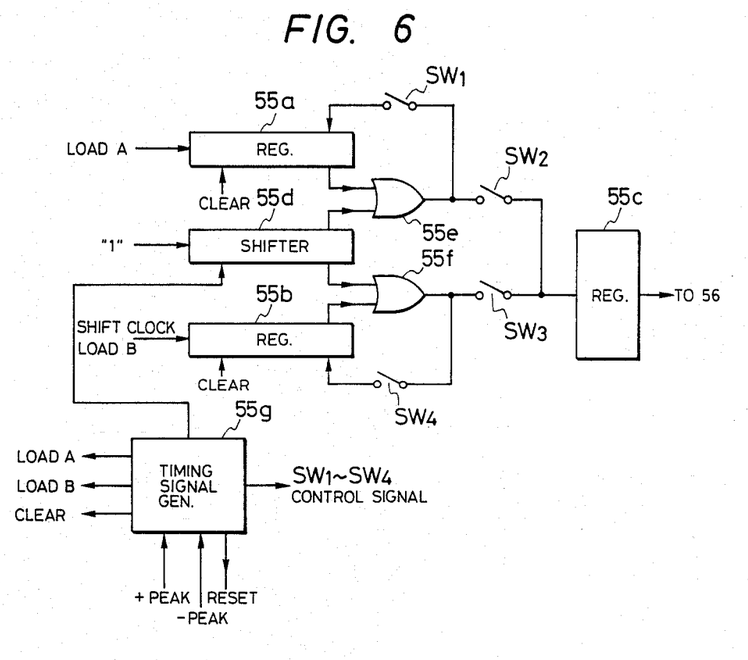
FIG. 6 is a diagram showing a detailed control circuit in the constitution of the circuit of FIG. 5.

FIG. 5 is a block diagram showing a constitution of the third embodiment of the invention. FIG. 6 is a block diagram showing the main section of a control circuit in an embodiment of the invention.

The measured signal is supplied to an analog comparator 52 through a buffer amplifier 51 and compared with the analog signal converted by a D/A converter 56. When the measured voltage level is higher than the analog voltage level from the D/A converter 56, a high voltage output is generated to the (+) side of the analog comparator 52. When the measured voltage level is lower than the analog voltage level from the D/A converter 56, a high voltage output is generated to the (−) side of the analog comparator 52.

NAND gates 53a and 53b receive the measure segment signal and open the gates. The (+) side output of the analog comparator 52 is input to the NAND gate 53a. The (−) side output of the analog comparator 52 is input to the NAND gate 53b. The output of the analog comparator 52 in the measure segment is taken out. An R-S flip-flop (hereinafter, simply referred to as a flip-flop) 54a is set by the output of the NAND gate 53a. A flip-flop 54b is set by the output of the NAND gate 53b. The Q output of the flip-flop 54a is supplied as a (+) peak signal to a control circuit 55. The Q output of the flip-flop 54b is supplied as a (−) peak signal to the control circuit 55. The control circuit 55 receives the (+) and (−) peak signals and converts into the digital data by the sequential comparing method. The converted output of each bit in the control circuit 55 is supplied to the D/A converter 56 and converted into the analog signal by the D/A converter 56.

As shown in FIG. 6, the main section of the control circuit 55 comprises registers 55a to 55c, a shifter 55d, OR gates 55e and 55f, a control timing signal generator 55g, and switches SW$_1$ to SW$_4$. The register 55a corresponds to the flip-flop 54a and stores the maximum value. The register 55b corresponds to the flip-flop 54b and stores the minimum value. The register 55c stores the data which is supplied to the D/A converter 56. In addition, the control circuit 55 comprises a subtractor (not shown) to subtract the content of the register 55b from the content of the register 55a and a register (not shown) to store the digital data corresponding to the voltage difference.

Figure 7A:
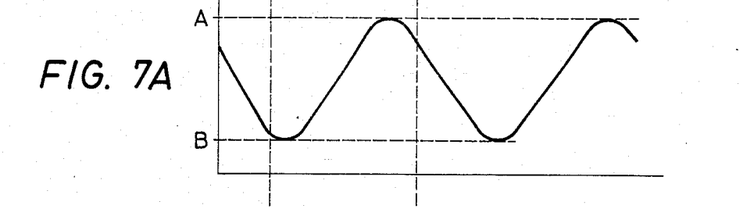
FIGS. 7A and 7B show a measured signal and a measure segment signal which are input to the circuit of FIG. 5, respectively.
Figure 7B:
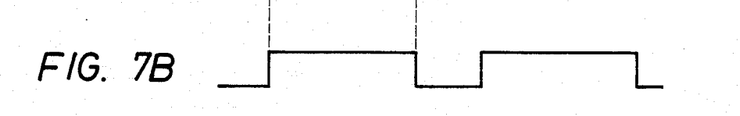

The operation of the embodiment constituted as explained above will now be described. FIG. 7A shows an example of the measured voltage waveform. FIG. 7B shows the measure segment signal. The measure segment signal is the high voltage signal and, e.g., the sweep interval signal displayed on the screen of an oscilloscope.

The digital data output from the control circuit 55 is converted into the analog signal by the D/A converter 56 and compared with the measured voltage supplied through the buffer amplifier 51 by the analog comparator 52.

The NAND gates 53a and 53b are opened in the measure segment. When the measured voltage level is higher than the analog voltage value from the D/A converter 56, the flip-flop 54a is set and the (+) peak signal is output to the control circuit 55. On the contrary, when the measured voltage level is lower than the analog voltage value from the D/A converter 56, the flip-flop 54b is set and the (−) peak signal is output to the control circuit 55. The (+) and (−) peak signals are read the number of times corresponding to the number of bits of the A/D converted output and are sequentially compared.

The control circuit 55 operates in the following manner for the above sequential comparison.

(a) The registers 55a and 55b are cleared by the 55g and at the same time, the flip-flops 54a and 54b are reset.

(b) The MSB of the shifter 55d is set to "1" in response to the shift clock.

(c) The OR of the content of the register 55a and the content of the shifter 55d is calculated by the OR gate 55e. Only the switch SW$_2$ is turned on and the output of the OR gate 55e is set into the register 55c. Therefore, for example, in the case of eight bits, "10000000" is registered into the register 55c and D/A converted to the analog signal. This analog signal is compared with the measured voltage by the analog comparator 52.

(d) As the result of the comparison, when the (+) peak signal is output, namely, when the Q output of the flip-flop 54a is set to the high voltage, the switch SW$_1$ is turned on and a load A signal is output. The output of the OR gate 55e is set into the register 55a. In this case, the maximum value of the measured voltage is larger than the analog converted value of "10000000", so that the MSB of the maximum value side is set to "1". On the contrary, when the Q output of the flip-flop 54a is set to the low voltage as the result of the comparison, the output of the OR gate 55e is not transferred. Thus, "00000000" is registered in the register 55a. In this state, the maximum value of the measured voltage is smaller than the analog converted value of "10000000", so that the MSB on the maximum value side is set to "0".

(e) In the subsequent measure segment in which the measure segment signal is then set to the high voltage, the OR of the content of the register 55b and the content of the shifter 55d is calculated by the OR gate 55f. Only the switch SW$_3$ is turned on and the output of the OR gate 55f is set into the register 55c. Therefore, the output of the register 55c is transmitted through the D/A converter 56 and compared by the analog comparator 52 similarly to the case of the foregoing item (c).

(f) As the result of the comparison, when the (−) peak signal is output, namely, when the Q output of the flip-flop 54b is set to the high voltage, the content of the register 55b is not changed. "00000000" is registered in the register 55b. In this state, the minimum value of the measured voltage is smaller than the analog converted value of "10000000". The MSB of the minimum value side is set to "0". On the contrary, as the result of the comparison, when the Q output of the flip-flop 54b is set to the low voltage, the switch SW$_4$ is turned on and a load B signal is output. The output of the OR gate 55f is set into the register 55b. In this state, "10000000" is registered in the register 55b and the minimum value of the measured voltage is larger than "10000000". The MSB on the minimum value side is set to "1".

(g) A reset pulse is output from the control timing signal generator 55g and the flip-flops 54a and 54b are reset.

(h) The content of the shifter 55d is shifted by one bit toward the LSB side and the MSB of the shifter 55d is set to "0". The processes in the above items (c) to (h) are executed to subsequently convert the next bit. In this example, after completion of each conversion of eight bits, point A of the maximum value in FIG. 7A is converted into the digital data of eight bits and set into the register 55a. Point B of the minimum value is converted into the digital data of eight bits and set into the register 55b.

(i) The difference between the contents of the registers 55a and 55b is calculated. Thus, the voltage difference between the maximum value and the minimum value of the measured voltage in the measure segment is derived.

One bit of the maximum value and one bit of the minimum value are sequentially converted every subsequent measure segment. In the above example, those bits are converted for sixteen measure segments, namely, for sixteen sweep intervals. Therefore, the conversion is performed for a constant period of time and one bit of the maximum value and one bit of the minimum value are alternately converted. Consequently, the long-time drifts of the buffer amplifier 51 and analog comparator 52 can be ignored.

The case where the control circuit 55 uses the registers 55a to 55c, OR gates 55e and 55f, and switches SW$_1$ to SW$_4$ has been shown and described above as an example However, a computer may be also used in place of the control circuit 55. In this case, the computer executes the processes in accordance with the following steps. It is now assumed that the register on the (+)

peak side is REG(+) and the register on the (−) peak side is REG(−).

STEP S1: The counter is set to the number of bits to be converted.

STEP S2: The MSB of the REG(+) is set to "1" and output to the D/A converter 56.

STEP S3: A reset pulse is output to the flip-flop 54a.

STEP S4: If the Q output of the flip-flop 54a has been inverted, the content of the REG(+) is held unchanged. If the Q output is not inverted, the MSB of the REG(+) is cleared.

STEP S5: The MSB of the REG(−) is set to "1" and output to the D/A converter 56.

STEP S6: A reset pulse is output to the flip-flop 54b.

STEP S7: If the Q output of the flip-flop 54b has been inverted, the content of the REG(−) is held unchanged. If it is not inverted, the MSB of the REG(−) is cleared.

STEP S8: The count value of the counter is decreased by "1" and a check is made to see if the count value is "0" or not. If it is "0", step S12 is executed.

STEP S9: The next significant bit is raised and the content of the REG(+) is output to the D/A converter 56.

STEP S10: A reset pulse is output and a check is made to see if the Q output of the flip-flop 54a has been inverted or not. If it has been inverted, the bit is held unchanged. If the Q output is not inverted, the bit which was set to "1" in step S9 is cleared.

STEP S11: The same processes as steps S9 and S10 are also executed on the side of the REG(−) and step S8 is performed.

STEP S12: The subtraction of (the content of the REG(+)) −(the content of the REG(−)) is performed.

According to the third embodiment, the voltage of (the maximum value—the minimum value) in an arbitrary measure segment displayed on the screen of the oscilloscope can be measured by the sequential comparison. In this measurement, since the measured voltage of either one bit of the maximum value or one bit of the minimum value is alternately converted into the digital data every measure segment, the long-time drifts of the analog comparator, amplifier, and the like can be ignored.

Figure 8:
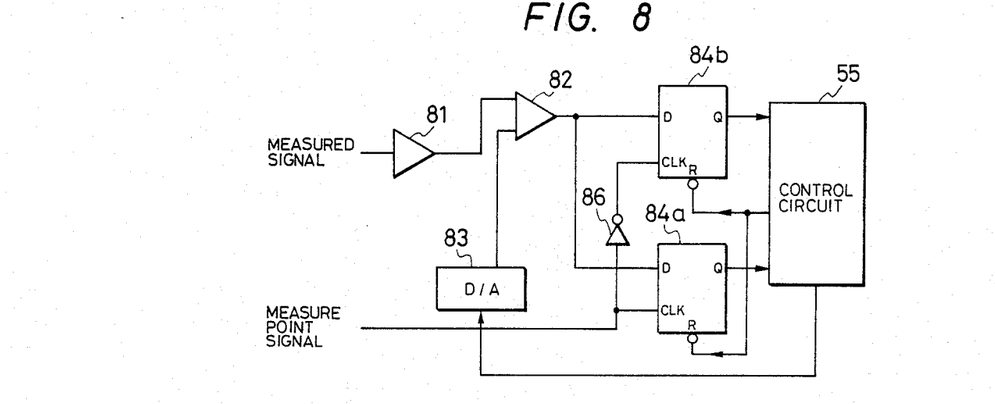
FIG. 8 shows a circuit constitutional diagram of a two-point voltage difference measuring equipment according to the fourth embodiment of the invention.

FIG. 8 is a block diagram showing a constitution of the fourth embodiment of the invention.

The measured signal is supplied through a buffer amplifier 81 to an analog comparator 82 and compared with the analog signal converted by a D/A converter 83. The output of the analog comparator 82 is supplied as data to D flip-flops 84a and 84b. A measure point segment signal whose both ends indicate measure points is supplied as a clock signal to the D flip-flop 84a. The measure point segment signal is also transmitted through an inverter 86 and supplied as a clock signal to the D flip-flop 84b.

The Q outputs of the D flip-flops 84a and 84b are supplied to a control circuit 55. The control circuit 55 receives the inverted Q outputs of the D flip-flops 84a and 84b and converts the measured signal into the digital data by the sequential comparing method. The converted output of each bit in the control circuit 55 is supplied to the D/A converter 83 and converted into the analog signal by the D/A converter 83. The constitution of the control circuit 55 is the same as the that shown in FIG. 6.

Figure 9A:
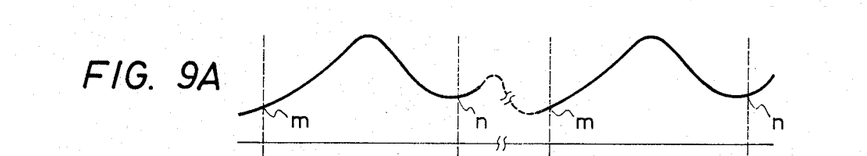
FIGS. 9A and 9B show a measured signal and a measure segment signal which are input to the circuit of FIG. 8, respectively.
Figure 9B:
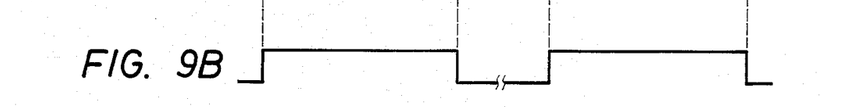

The operation of this embodiment constituted as mentioned above will now be described. FIG. 9A shows an example of a measured voltage waveform. FIG. 9B shows a measure point signal and this signal is formed by, e.g., a sweep signal of an oscilloscope. The measure point signal is the signal of a high voltage. It is assumed that the leading edge of this signal is set to the first measure point and the trailing edge is set to the second measure point.

The digital data output from the control circuit 55 is converted into the analog signal by the D/A converter 83 and compared with the measured voltage supplied through the buffer amplifier 81 by the analog comparator 82.

The output of the analog comparator 82 is input to the D flip-flop 84a at the first measure point. The output of the analog comparator 82 is input to the D flip-flop 84b at the second measure point. When the measured voltage level is higher than the analog voltage value from the D/A converter 83, the analog comparator 82 generates a high voltage output. The control circuit 85 reads the Q outputs of the D flip-flops 84a and 84b the number of times corresponding to the number of bits of the A/D converted output and sequentially compares them.

The operation of the control circuit 55 for the sequential comparison will now be explained with reference to FIGS. 6, 9A, and 9B.

(a) The registers 55a and 55b are cleared in response to a clear output signal from the control timing signal generator 55g and at the same time, the D flip-flops 54a and 54b are reset.

(b) The MSB of the shifter 55d is set to "1" in response to a shift clock.

(c) The OR of the content of the register 55a and the content of the shifter 55d is calculated by the OR gate 55e. Only the switch SW$_2$ is turned on and the output of the OR gate 55e is set into the register 55c. Therefore, for example, in the case of eight bits, "10000000" is registered into the register 55c. "10000000" is D/A converted into the analog signal. This analog signal is compared with the measured voltage by the analog comparator substantially at the first measure point.

(d) The result of the comparison is input to the D flip-flop 54a. In this case, when the Q output of the D flip-flop 54a is set to the high voltage, the switch SW$_1$ is turned on and the load A signal is output. The output of the OR gate 55e is set into the register 55a. In this state, "10000000" is registered in the register 55a. At the first measure point, the measured voltage is larger than the analog converted value of "10000000" and the MSB is set to "1". As the result of the comparison at the first measure point, when the Q output of the D flip-flop 54a is not set to the high voltage, the output of the OR gate 55e is not transferred to the register 55a. Therefore, "00000000" is registered in the register 55a. In this state, the measured voltage is smaller than the analog converted value of "10000000" at the first measure point and the MSB is set to "0".

(e) At the next second measure point, the OR operation of the content of the register 55b and the content of the shifter 55d is taken by the OR gate 55f. Only the switch SW$_3$ is turned on and the output of the OR gate 55f is set into the register 55c. Therefore, the output of the control circuit 55 is transmitted through the D/A converter 83 and compared with the measured voltage by the analog comparator 82 substantially at the second measure point similarly to the case of the foregoing item (c).

(f) The result of the comparison is input to the D flip-flop 84b. In this case, if the Q output of the D flip-flop 84b is set to the high voltage, the switch SW4 is turned on and the load B signal is output. The output of the OR gate 55f is set into the register 55b. In this state, "10000000" is registered in the register 55b and the measured voltage is larger than the analog converted value of "10000000" at the second measure point. The MSB is set to "1". On the contrary, as the result of the comparison at the second measure point, if the Q output of the D flip-flop 84b is set to the low voltage, the output of the OR gate 55f is not transferred to the register 55b. Thus, "00000000" is registered in the register 55b. In this state, the measured voltage is smaller than the analog converted value of "10000000" at the second measure point and the MSB is set to "0".

(g) A reset pulse is generated from the control timing signal generator 55g and the D flip-flops 84a and 84b are reset.

(h) The content of the shifter 55d is shifted by one bit toward the LSB side. The MSB of the shifter 55d is set to "0". The processes of the foregoing items (c) to (h) are executed in order to subsequently convert the next bit. In this example, after completion of each conversion of eight bits, the level m at the first measure point shown in FIG. 9A is converted into the digital data of eight bits and set into the register 55a. The level n at the second measure point is converted into the digital data of eight bits and set into the register 55b.

(i) The difference between the contents of the registers 55a and 55b is calculated. Thus, the voltage difference between the voltages at the first and second measure points is derived.

Namely, one bit at the next first measure point and one bit at the subsequent second measure point are sequentially converted. In this manner, the conversion is performed in sixteen measure point segments, i.e., sixteen sweep intervals in the foregoing example. Since the conversion is performed one bit by one for a constant period of time, the long time drifts of the buffer amplifier 81 and analog comparator 82 can be ignored.

The case of the control circuit 55 has been shown and described above as an example. However, a computer may be also used in place of this control circuit. In this case, the processes are executed in accordance with the following steps. It is now assumed that the register 55a is referred to as a REG(+) and the register 55b is referred to as a REG(−).

STEP S1: The counter is set to the number of bits to be converted.

STEP S2: The MSB of the REG(+) is set to "1" and output to the D/A converter 83.

STEP S3: A reset pulse is output to the D flip-flop 84a.

STEP S4: If the Q output of the D flip-flop 84a has been inverted, the content of the REG(+) is held unchanged. If the Q output is not inverted, the MSB of the REG(+) is cleared.

STEP S5: The MSB of the REG(−) is set to "1" and output to the D/A converter 83.

STEP S6: A reset pulse is output to the D flip-flop 84b.

STEP S7: If the Q output of the D flip-flop 84b has been inverted, the content of the REG(−) is held unchanged. If the Q output is not inverted, the MSB of the REG(−) is cleared.

STEP S8: The count value of the counter is decreased by "1" and a check is made to see if the count value is "0" or not. If the count value is "0", step S12 is executed.

STEP S9: The next significant bit is raised and the content of the REG(+) is output to the D/A converter 83.

STEP S10: A reset pulse is output and a check is made to see if the Q output of the D flip-flop 84a has been inverted or not. If the Q output has been inverted, the bit is held unchanged. If the Q output is not inverted, the bit which was set to "1" in step S9 is cleared.

STEP S11: The same processes as steps S9 and S10 are also executed on the REG(−) side and step S8 is executed.

STEP S12: The subtraction of (the content of the REG(+)) −(the content of the REG(−)) is performed.

According to the foregoing fourth embodiment, the measured voltages at arbitrary first and second measure points on the screen of the oscilloscope can be converted into the digital data one bit by one by the sequential comparison for the period of time above one sweep interval. Therefore, the voltage difference can be obtained by the difference between the converted voltages. On the other hand, the long time drifts of the analog comparator, amplifier, and the like can be ignored. Further, by sequentially changing the measure point segment and, for example, by sequentially allowing the second measure point to be away from the first measure point from the close state, the A/D converter of the embodiment can be also used as an A/D converter of such a digital storage oscilloscope that the measured voltage is sequentially converted into the digital value and stored.

What is claimed is:

1. A measuring circuit of measuring a value of an analog input signal at a selected position, the circuit comprising:
    means for receiving a periodic analog input signal for a predetermined period;
    means for generating a digital signal which advances by a predetermined digital value step for every said predetermined period;
    means for converting said digital signal into an analog reference signal for every said predetermined period;
    means for comparing the input analog signal with the converted analog reference signal;
    means for generating a timing acquisition signal in a preselected position for every said predetermined period; and
    means responsive to said timing acquisition signal for registering the value of the digital signal as a measuring value when the comparison in said comparing means has a specific result.

2. A measuring circuit according to claim 1, wherein:
    said digital signal means increases the digital signal by the predetermined digital value step for said every predetermined period,
    said comparing means includes a comparator means (e.g., 31) for outputting logic "1" when the converted analog reference signal is equal to or larger than the sample input analog signal and otherwise logic "0", and D flip-flop means (e.g., 32, 33) for entering the output of said comparator means as data in response to a timing signal of determining the selected position, and
    said registering means (e.g., 35) in response to the transition from logic "0" to logic "1" of the output of said D flip-flop means for registering the value of the digital signal.

* * * * *